(12) United States Patent
Akram et al.

(10) Patent No.: US 7,193,306 B2
(45) Date of Patent: Mar. 20, 2007

(54) SEMICONDUCTOR STRUCTURE HAVING STACKED SEMICONDUCTOR DEVICES

(75) Inventors: Salman Akram, Boise, ID (US); Jerry Michael Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 10/409,008

(22) Filed: Apr. 8, 2003

(65) Prior Publication Data

US 2003/0209791 A1    Nov. 13, 2003

Related U.S. Application Data

(63) Continuation of application No. 09/906,284, filed on Jul. 16, 2001, now Pat. No. 6,603,198, which is a continuation of application No. 09/141,690, filed on Aug. 28, 1998, now Pat. No. 6,313,522.

(51) Int. Cl.
*H01L 23/02* (2006.01)
(52) U.S. Cl. ........................... 257/686; 257/723
(58) Field of Classification Search ................ 257/686, 257/723, 737, 738, 774, 778, 777
See application file for complete search history.

(56) References Cited

U.S. PATENT DOCUMENTS

| | | | |
|---|---|---|---|
| 5,012,323 A | 4/1991 | Farnworth | |
| 5,121,293 A | 6/1992 | Conte | |
| 5,128,831 A | 7/1992 | Fox, III et al. | |
| 5,189,505 A | 2/1993 | Bartelink | |
| 5,289,337 A | 2/1994 | Aghazadeh et al. | |
| 5,291,061 A | 3/1994 | Ball | |
| 5,323,060 A | 6/1994 | Fogal et al. | |
| 5,385,869 A | 1/1995 | Liu et al. | |
| 5,422,435 A | 6/1995 | Takiar et al. | |
| 5,434,745 A | 7/1995 | Shokrgozar et al. | |
| 5,474,957 A | 12/1995 | Urushima | |
| 5,495,398 A | 2/1996 | Takiar et al. | |
| 5,513,076 A | 4/1996 | Werther | |
| 5,535,101 A * | 7/1996 | Miles et al. | 361/808 |
| 5,607,099 A | 3/1997 | Yeh et al. | |
| 5,784,260 A | 7/1998 | Fuller, Jr. et al. | |
| 5,945,741 A | 8/1999 | Ohsawa et al. | |

(Continued)

FOREIGN PATENT DOCUMENTS

EP    0 488 057 A1    6/1992

(Continued)

OTHER PUBLICATIONS

Nikkei Electronics, Feb. 28, 1994, No. 602, pp. 111-117.

*Primary Examiner*—Roy Potter
(74) *Attorney, Agent, or Firm*—Dinsmore & Shohl LLP

(57) ABSTRACT

A semiconductor structure includes flip chips or other semiconductor devices that are mounted on printed circuit boards. The printed circuit boards are stacked to increase the circuit density of the semiconductor structure. The printed circuit boards include cavities or openings to accommodate the flip chips or semiconductor devices and thus reduce the overall size of the semiconductor structure. The flip chips or semiconductor devices from adjacent printed circuit boards may extend into the cavities or openings or simply occupy the cavities or openings from the same printed circuit board.

45 Claims, 6 Drawing Sheets

U.S. PATENT DOCUMENTS

| | | | | |
|---|---|---|---|---|
| 5,963,430 A | * | 10/1999 | Londa | 361/790 |
| 6,008,536 A | * | 12/1999 | Mertol | 257/704 |
| 6,020,629 A | | 2/2000 | Farnworth et al. | |
| 6,025,648 A | | 2/2000 | Takahashi et al. | |
| 6,137,163 A | | 10/2000 | Kim et al. | |
| 6,172,419 B1 | | 1/2001 | Kinsman | |
| 6,313,522 B1 | | 11/2001 | Akram et al. | |
| 6,531,337 B1 | | 3/2003 | Akram et al. | |
| 6,531,338 B2 | | 3/2003 | Akram et al. | |

FOREIGN PATENT DOCUMENTS

| | | |
|---|---|---|
| JP | 3-261165 | 11/1991 |
| JP | 4-110653 | 4/1992 |
| JP | 5-82567 | 4/1993 |
| JP | 5-326625 | 12/1993 |
| JP | 6-224246 | 8/1994 |

* cited by examiner

SEMICONDUCTOR STRUCTURE HAVING STACKED SEMICONDUCTOR DEVICES

CROSS-REFERENCE TO RELATED APPLICATIONS

This is a continuation application of application Ser. No. 09/906284 filed Jul. 16, 2001 now U.S. Pat. No. 6,603,198 entitled "SEMICONDUCTOR STRUCTURE HAVING STACKED SEMICONDUCTOR DEVICES", which is a continuation of application Ser. No. 09/141,690, now U.S. Pat. No. 6,313,522 filed on Aug. 28, 1998. This application is further related to U.S. Pat. No. 6,531,388 filed Jul. 31, 2002, which is a continuation of U.S. Pat. No. 6,531,337 filed Jul. 24, 2000, which is also a divisional of U.S. Pat. No. 6,313,522.

BACKGROUND OF THE INVENTION

The present invention relates in general to an apparatus and method for increasing semiconductor device density, and, more particularly, to arranging semiconductor devices within and over substrates to achieve densely packaged semiconductor structures.

Chip On Board techniques are used to attach semiconductor dice to a printed circuit board, including flip chip attachment, wirebonding, and tape automated bonding (TAB). Flip chip attachment consists of attaching a flip chip to a printed circuit board or other substrate. A flip chip is a semiconductor chip that has a pattern or array of electrical terminations or bond pads spaced around an active surface of the flip chip for face down mounting of the flip chip to a substrate. Generally, the flip chip has an active surface having Ball Grid Array (BGA) or PIN Grid Array (PGA) electrical connectors. The BGA comprises an array of minute solder balls disposed on the surface of the flip chip that attaches to the substrate (the attachment surface). The PGA comprises an array of small pins that extend substantially perpendicular from the attachment surface of the flip chip. The pins conform to a specific arrangement on a printed circuit board or other substrate for attachment thereto.

With the BGA, the solder or other conductive ball arrangement on the flip chip must be a mirror-image of the connecting bond pads on the printed circuit board such that precise connection is made. The flip chip is bonded to the printed circuit board by refluxing the solder balls. The solder balls may also be replaced with a conductive polymer. With the PGA, the pin arrangement of the flip chip must be a mirror-image of the pin recesses on the printed circuit board. After insertion, the flip chip is generally bonded by soldering the pins into place. An under-fill encapsulant is generally disposed between the flip chip and the printed circuit board for environmental protection and to enhance the attachment of the flip chip to the printed circuit board.

Wirebonding attachment generally begins with attaching a semiconductor chip to the surface of a printed circuit board with an appropriate adhesive, such as an epoxy. In wirebonding, bond wires are attached, one at a time, to each bond pad on the semiconductor chip and extend to a corresponding lead, trace end or bond pad on the printed circuit board. The bond wires are generally attached using industry-standard wirebonding techniques, such as ultrasonic bonding, thermocompression bonding or thermosonic bonding. Ultrasonic bonding comprises the combination of pressure and ultrasonic vibration bursts to form a metallurgical cold weld. Thermocompression bonding comprises the combination of pressure and elevated temperature to form a weld. Thermosonic bonding comprises the combination of pressure, elevated temperature, and ultrasonic vibration bursts to form a weld. The semiconductor chip may be oriented either face up or face down (with its active surface and bond pads either up or down with respect to the circuit board) for wire bonding, although face up orientation is more common. With TAB, ends of metal leads carried on an insulating tape, such as a polyamide, are respectively attached to the bond pads on the semiconductor chip and to the lead or trace ends on the printed circuit board. An encapsulant is generally used to cover the bond wires and the metal tape leads to prevent contamination.

Higher performance, lower cost, increased miniaturization of components, and greater packaging density of integrated circuits are ongoing goals of the computer industry. As new generations of integrated circuit products are released, the number of devices used to fabricate them tends to decrease due to advances in technology even though the functionality of these products increases. For example, on the average, there is approximately a 10 percent decrease in components for every product generation over the previous generation with equivalent functionality.

In integrated circuit packaging, in addition to component reduction, surface mount technology has demonstrated an increase in semiconductor chip density on a single substrate or board despite the reduction of the number of components. This results in more compact designs and form factors, and a significant increase in integrated circuit density. However, greater integrated circuit density is primarily limited by the space or "real estate" available for mounting dice on a substrate, such as a printed circuit board.

One method of further increasing integrated circuit density is to stack semiconductor dice vertically. U.S. Pat. No. 5,012,323 issued Apr. 30, 1991 to Farnworth teaches combining a pair of dice mounted on opposing sides of a lead frame. An upper, smaller die is back-bonded to the upper surface of the leads of the lead frame via a first adhesively coated, insulated film layer. A lower, larger die is face-bonded to the lower lead frame die-bonding region via a second, adhesively coated, insulative, film layer. The wire-bonding pads on both upper die and lower die are interconnected with gold or aluminum bond wires to the ends of their associated lead extensions. The lower die must be slightly larger than the upper die so that the die pads are accessible from above through a bonding window in the lead frame to allow the gold wire connections to be made to the lead extensions. This arrangement has a major disadvantage from a production standpoint as the same size die cannot be used.

U.S. Pat. No. 5,291,061 issued Mar. 1, 1994 to Ball teaches a multiple stacked dice device containing up to four stacked dice supported on a die-attach paddle of a lead frame. The assembly does not exceed the height of current single die packages and the bond pads of each die are wirebonded to lead fingers. The low profile of the device is achieved by close-tolerance stacking which is made possible by a low-loop-profile wirebonding operation and thin adhesive layers between the stacked dice. However, Ball requires long bond wires to electrically connect the stacked dice to the lead frame. These long bond wires increase resistance and may result in bond wire sweep during encapsulation. Also, Ball requires the use of spacers between the dice.

U.S. Pat. No. 5,323,060 issued Jun. 21, 1994 to Fogal et al. (Fogal) teaches a multichip module that contains stacked die devices. The terminals or bond pads of die devices are wirebonded to a substrate or to adjacent die devices. However, as discussed with Ball, Fogal requires long bond wires to electrically connect the stacked dice bond pads to the substrate. Fogal also require the use of spacers between the die.

U.S. Pat. Nos. 5,422,435 and 5,495,398 to Takiar et al. (Takiar) teach stacked dice having bond wires extending to each other and to the leads of a carrier member such as a lead frame. Takiar also has the problem of long bond wires, as well as, requiring specific sized or custom designed dice to achieve a proper stacked combination.

U.S. Pat. No. 5,434,745 issued Jul. 18, 1995 to Shokrgozar et al. (Shokrgozar) discloses a stackable packaging module comprising a standard die attached to a substrate with a spacer frame placed on the substrate to surround the die. The substrate/die/spacer combinations are stacked one atop another to form a stacked assembly. The outer edge of the spacer frame has grooves in which a conductive epoxy is disposed. The conductive epoxy forms electric communication between the stacked layers and/or to the final substrate to which the stacked assembly is attached. However, Shokrgozar requires specialized spacer frames and a substantial number of assembly steps, both of which increase the cost of the final assembly.

U.S. Pat. No. 5,128,831 issued Jul. 7, 1992 to Fox, III et al. (Fox) also teaches a standard die attached to a substrate with a spacer frame placed on the substrate to surround the die. The stacked layers and/or the final substrate are in electric communication with conductive epoxy extending through the spacer frames. However, Fox also requires specialized spacer frames, numerous assembly steps, and is limited in its flexibility to utilize a variety of dice.

Another prior art stacking arrangement is shown in FIG. 1. A plurality of printed circuit boards 10 are stacked on top of each other and on top of a motherboard 12. Each of the printed circuit boards 10 include a semiconductor die 14 mounted to a top surface of each respective printed circuit board 10 using methods known in the art. Bond pads on each die are electrically coupled to each respective printed circuit board 10. The printed circuit boards 10 and the motherboard 12 are electrically and physically coupled together using solder balls 16. It should be apparent that the solder balls 16 must be sufficiently thick so that the printed circuit boards 10 do not contact or interfere with adjacent dies 14. The thick solder balls 16 increase the overall size of the structure and the length of the signal paths.

Accordingly, there is an ongoing need for semiconductor structures having increased circuit density. There is a further need for semiconductor structures in which printed circuit boards are stacked to increase circuit density. There is a still further ongoing need for semiconductor structures having shorter signal paths. Preferably, such semiconductor structures are relatively inexpensive, easy to manufacture, and use standard die configurations and components.

SUMMARY OF THE INVENTION

The present invention meets these needs by providing a semiconductor structure in which flip chips or other semiconductor devices are mounted on printed circuit boards. The printed circuit boards are stacked to increase the circuit density of the semiconductor structure. The printed circuit boards include cavities or openings to accommodate the flip chips or semiconductor devices and thus reduce the overall size of the semiconductor structure. The flip chips or semiconductor devices from adjacent printed circuit boards may extend into the cavities or openings or simply occupy the cavities or openings from the same printed circuit board.

According to a first aspect of the present invention, a semiconductor structure comprises a base substrate, a first substrate and at least one semiconductor. The base substrate comprises a first surface having a first plurality of base substrate bond pads formed thereon. The first substrate comprises a first surface, a second surface and at least one cavity formed therein. One of the first and second surfaces includes a first plurality of first substrate bond pads. At least one of the first plurality of first substrate bond pads is electrically coupled to at least one of the first plurality of base substrate bond pads. The semiconductor device includes a plurality of semiconductor device bond pads. The semiconductor device is positioned generally within the cavity of the first substrate between the base substrate and the first substrate with at least one of the plurality of semiconductor device bond pads electrically coupled to at least one of the first plurality of base substrate bond pads.

The other of the first and second surfaces of the first substrate may comprise a second plurality of first substrate bond pads while the semiconductor structure may further comprise a second semiconductor device having a plurality of second semiconductor device bond pads. At least one of the plurality of second semiconductor device bond pads is electrically coupled to at least one of the second plurality of first substrate bond pads. A center of the at least one semiconductor device and a center of the second semiconductor device may be substantially aligned about a line substantially perpendicular to the base substrate and the first substrate.

The semiconductor structure may further comprise a plurality of semiconductor devices, each comprising a plurality of bond pads formed thereon. The first substrate may comprise a plurality of cavities with each of the plurality of semiconductor devices being positioned within respective ones of the plurality of cavities and at least one of the plurality of bond pads of each of the plurality of semiconductor devices electrically coupled to respective ones of the plurality of bond pads of the base substrate. The semiconductor device may comprise a semiconductor die formed within a semiconductor package. The semiconductor package may comprise a package selected from the group consisting of a chip-scale package, a ball grid array, a chip-on-board, a direct chip attach, and a flip-chip.

Preferably, the semiconductor device is electrically and physically coupled to the base substrate via solder balls coupling at least one of the plurality of semiconductor device bond pads to at least one of the first plurality of base substrate bond pads. The first substrate is preferably electrically and physically coupled to the base substrate via solder balls coupling at least one of the first plurality of first substrate bond pads to at least one of the first plurality of base substrate bond pads. The base substrate may further comprise a second surface having a second plurality of base substrate bond pads formed thereon. Preferably, at least one of the second plurality of base substrate bond pads is electrically coupled to external circuitry. The base substrate may further comprise a plurality of base substrate trace leads electrically coupling at least a portion of the first plurality of base substrate bond pads to at least a portion of the second plurality of base substrate bond pads.

According to another aspect of the present invention, a semiconductor structure comprises a base substrate, a first substrate, a second substrate, a first semiconductor device and a second semiconductor device. The base substrate includes a first surface having a first plurality of base substrate bond pads formed thereon and a second surface having a second plurality of base substrate bond pads formed thereon. The base substrate further comprises a plurality of base substrate trace leads electrically coupling at least a portion of the first plurality of base substrate bond pads to at least a portion of the second plurality of base substrate bond pads. The first substrate includes a first surface, a second surface, and at least one cavity formed therein. The first surface of the first substrate comprises a first plurality of first substrate bond pads formed thereon and the second surface of the first substrate comprises a second plurality of first substrate bond pads formed thereon. The first substrate is electrically and physically coupled to the base substrate via solder balls coupling at least one of the first plurality of first substrate bond pads to at least one of the first plurality of base substrate bond pads. The second substrate includes a first surface, a second surface, and at least one cavity formed therein. The first surface of the second substrate includes a first plurality of second substrate bond pads formed thereon and the second surface of the second substrate comprises a second plurality of second substrate bond pads formed thereon. The second substrate is electrically and physically coupled to the first substrate via solder balls coupling at least one of the second plurality of first substrate bond pads to at least one of the first plurality of second substrate bond pads. The first semiconductor device includes a plurality of first semiconductor device bond pads formed thereon. The first semiconductor device is positioned generally within the cavity of the first substrate and is physically and electrically coupled to the base substrate via solder balls coupling at least one of the plurality of first semiconductor device bond pads to at least one of the first plurality of base substrate bond pads. The second semiconductor device includes a plurality of second semiconductor device bond pads formed thereon. The second semiconductor device is positioned generally within the cavity of the second substrate and is physically and electrically coupled to the first substrate via solder balls coupling at least one of the plurality of second semiconductor device bond pads to at least one of the second plurality of first substrate bond pads.

According to yet another aspect of the present invention, the semiconductor structure comprises a base substrate, a first substrate and at least one semiconductor device. The base substrate comprises a first surface having a first plurality of base bond pads formed thereon. The first substrate includes a first surface, a second surface and at least one opening formed therein. One of the first and second surfaces includes a first plurality of first substrate bond pads with at least one of the first plurality of first substrate bond pads being electrically coupled to at least one of the first plurality of substrate base bond pads. The semiconductor device includes a plurality of semiconductor device bond pads. The semiconductor device is positioned generally within the opening of the first substrate between the base substrate and the first substrate with at least one of the plurality of semiconductor device bond pads electrically coupled to at least one of the first plurality of base substrate bond pads. Preferably, the semiconductor device is electrically and physically coupled to the base substrate via solder balls coupling at least one of the plurality of semiconductor device bond pads to at least one of the first plurality of base substrate bond pads.

According to a further aspect of the present invention, a semiconductor structure comprises a first substrate, an interconnect device and at least one semiconductor device. The first substrate has at least one opening and a surface including a plurality of first substrate bond pads formed thereon. The interconnect device is positioned over the opening of the first substrate and is coupled thereto. The semiconductor device includes a plurality of semiconductor device bond pads. The semiconductor device is positioned generally over the opening of the first substrate and is coupled to the interconnect device.

The interconnect device may comprise a plurality of contacts with at least one of the plurality of contacts being electrically coupled to at least one the plurality of semiconductor device bond pads. At least one of the plurality of contacts is preferably electrically coupled to at least one the plurality of first substrate bond pads.

According to a still further aspect of the present invention, a semiconductor structure comprises a base substrate, a first substrate, a first semiconductor device and a second semiconductor device. The base substrate includes a first surface having a first plurality of base bond pads formed thereon. The first substrate includes a first surface having a first plurality of first substrate bond pads, a second surface having a second plurality of first substrate bond pads, and at least one opening formed therein. At least one of the first plurality of first substrate bond pads is electrically coupled to at least one of the first plurality of base substrate bond pads. The interconnect device is positioned over the opening of the first substrate and is coupled to the first substrate. The first semiconductor device includes a plurality of first semiconductor device bond pads. The first semiconductor device is positioned generally within the opening of the first substrate between the base substrate and the first substrate with at least one of the plurality of first semiconductor device bond pads electrically coupled to at least one of the first plurality of base substrate bond pads. The second semiconductor device includes a plurality of second semiconductor device bond pads. The second semiconductor device is positioned generally over the opening of the first substrate and is coupled to the interconnect device.

Preferably, the interconnect structure is electrically and physically coupled to the second surface of the first substrate. At least one of the second semiconductor device bond pads is electrically coupled to the first substrate through the interconnect device. The first substrate may further comprise a plurality of first substrate trace leads electrically coupling at least a portion of the first plurality of first substrate bond pads to respective ones of a first plurality of contacts on the interconnect device. At least one of the second semiconductor device bond pads may be electrically coupled to the first substrate via a bond wire. The interconnect structure may comprise a flex circuit or TAB tape. The semiconductor structure may further comprise a plurality of the first substrates, a plurality of the first semiconductor devices and a plurality of interconnect devices.

According to a yet still further aspect of the present invention, a semiconductor structure comprises a base substrate, a first substrate, a second substrate, a first interconnect device, a second interconnect device, a first semiconductor device, a second semiconductor device and a third semiconductor device. The base substrate includes a first surface having a first plurality of base substrate bond pads formed thereon and a second surface having a second plurality of base substrate bond pads formed thereon. The base substrate further comprises a plurality of base substrate trace leads electrically coupling at least a portion of the first plurality of base substrate bond pads to at least a portion of the second plurality of base substrate bond pads. The first substrate includes a first surface, a second surface and at least one opening formed therein. The first surface of the first substrate comprises a first plurality of first substrate bond pads formed thereon and the second surface of the first substrate comprises a second plurality of first substrate bond pads formed thereon. The first substrate is electrically and physically coupled to the base substrate via solder balls coupling at least one of the first plurality of first substrate bond pads to at least one of the first plurality of base substrate bond pads. The first substrate further comprises a plurality of first substrate trace leads electrically coupling at least a portion of the first plurality of first substrate bond pads to at least a portion of the second plurality of first substrate bond pads. The second substrate includes a first surface, a second surface and at least one opening formed therein. The first surface of the second substrate comprises a first plurality of second substrate bond pads formed thereon and the second surface of the second substrate comprises a second plurality of second substrate bond pads formed thereon. The second substrate is electrically and physically coupled to the first substrate via solder balls coupling at least one of the first plurality of second substrate bond pads to at least one of the second plurality of first substrate bond pads. The second substrate further comprises a plurality of second substrate trace leads electrically coupling at least a portion of the first plurality of second substrate bond pads to at least a portion of the second plurality of second substrate bond pads. The first interconnect device is positioned over the opening of the first substrate and is physically and electrically coupled to the first substrate. The first interconnect structure comprises a plurality of first interconnect device contacts. The second interconnect device is positioned over the at least one opening of the second substrate and physically and electrically coupled to the second substrate. The second interconnect structure also comprises a plurality of second interconnect device contacts. The first semiconductor device includes a plurality of first semiconductor device bond pads. The first semiconductor device is positioned within the opening of the first substrate between the base substrate and the first substrate and is physically and electrically coupled to the base substrate via solder balls coupling at least one of the plurality of first semiconductor device bond pads to at least one of the first plurality of base substrate bond pads. The second semiconductor device includes a plurality of second semiconductor device bond pads. The second semiconductor device is positioned within the opening of the second substrate between the first substrate and the second substrate and is physically and electrically coupled to the first interconnect device via solder balls coupling at least one of the plurality of second semiconductor device bond pads to at least one of the plurality of first interconnect device contacts. The third semiconductor device includes a plurality of third semiconductor device bond pads. The third semiconductor device is physically and electrically coupled to the second interconnect device via solder balls coupling at least one of the plurality of third semiconductor device bond pads to at least one of the plurality of second interconnect device contacts.

According to another aspect of the present invention, a semiconductor structure comprises a first substrate, an interconnect device and at least one semiconductor device. The first substrate includes at least one opening and a surface including a plurality of first substrate bond pads. The interconnect device is positioned over the opening of the first substrate and is coupled to the first substrate. The semiconductor device includes a plurality of semiconductor device bond pads. The semiconductor device is positioned generally within the opening of the first substrate and is coupled to the interconnect device. The interconnect device may be electrically non-conductive. The interconnect device may not be electrically coupled to the first substrate such that at least one of the plurality of semiconductor bond pads is electrically coupled to at least one of the plurality of first substrate bond pads via a bond wire. The interconnect device may comprise a flex circuit.

According to yet another aspect of the present invention, a semiconductor structure comprises a base substrate, a first substrate, a second substrate, a first interconnect device, a second interconnect device, a first semiconductor device and a second semiconductor device. The base substrate includes a first surface having a first plurality of base substrate bond pads formed thereon. The first substrate includes a first surface having a first plurality of first substrate bond pads, a second surface having a second plurality of first substrate bond pads, and at least one opening. At least one of the first plurality of first substrate bond pads is electrically coupled to at least one of the first plurality of base substrate bond pads. The second substrate includes a first surface having a first plurality of second substrate bond pads, a second surface having a second plurality of second substrate bond pads, and at least one opening. At least one of the first plurality of second substrate bond pads is electrically coupled to at least one of the second plurality of first substrate bond pads. The first interconnect device is positioned over the opening of the first substrate and is coupled to the first substrate. The second interconnect device is positioned over the opening of the second substrate and is coupled to the second substrate. The first semiconductor device includes a plurality of first semiconductor device bond pads. The first semiconductor device is positioned generally within the opening of the first substrate and is coupled to the first interconnect device. The second semiconductor device includes a plurality of second semiconductor device bond pads. The second semiconductor device is positioned generally within the opening of the second substrate and is coupled to the second interconnect device.

The first interconnect device may be physically but not electrically coupled to the first surface of the first substrate. The first interconnect device may be physically but not electrically coupled to the first semiconductor device. At least one of the plurality of first semiconductor bond pads is electrically coupled to at least one of the second plurality of first substrate bond pads via a bond wire. The plurality of first semiconductor device bond pads may be positioned on a frontside of the first semiconductor device. A backside of the first semiconductor device may be electrically coupled to the first interconnect device and at least one of the plurality of first semiconductor bond pads may be electrically coupled to at least one of the second plurality of first substrate bond pads via a bond wire.

According to yet another aspect of the present invention, a method of manufacturing a semiconductor structure comprises providing a base substrate having a first surface. A first plurality of base substrate bond pads are formed on the first surface of the base substrate. A first substrate is provided having a first surface, a second surface, and at least one cavity formed within the first surface of the first substrate. A first plurality of first substrate bond pads are formed on the first surface of the first substrate. At least one semiconductor device is provided having a plurality of semiconductor device bond pads. At least one of the plurality of semiconductor device bond pads is coupled to at least one of the first plurality of base substrate bond pads. The first substrate is positioned over the first surface of the base substrate such that the semiconductor device is generally within the cavity of the first surface. At least one of the first plurality of first substrate bond pads is coupled to at least one of the first plurality of base substrate bond pads.

According to a further aspect of the present invention, a method of manufacturing a semiconductor structure comprises providing a first substrate having at least one opening. A plurality of first substrate bond pads are formed on a surface of the first substrate. An interconnect device is provided. The interconnect device is coupled to the first substrate generally over the opening of the substrate. At least one semiconductor device is provided having a plurality of semiconductor device bond pads. The semiconductor device is coupled to the interconnect device generally over the opening of the first substrate.

According to another aspect of the present invention, a method of manufacturing a semiconductor structure comprises providing a first substrate having at least one opening. A plurality of first substrate bond pads are formed on a surface of the first substrate. An interconnect device is provided. The interconnect device is coupled to the first substrate generally over the opening of the first substrate. At least one semiconductor device is provided having a plurality of semiconductor device bond pads. The semiconductor device is coupled to the interconnect device generally within the opening of the first substrate.

Accordingly, it is an object of the present invention to provide a semiconductor structure having increased circuit density. It is another object of the present invention to provide a semiconductor structure having shorter signal paths. Preferably, such semiconductor structures are relatively inexpensive, easy to manufacture and use standard dies and components. Other features and advantages of the invention will be apparent from the following description, the accompanying drawings and the appended claims.

Note: The figures do not include section lines for clarity. Additionally, all figures are illustrative and not drawn to scale.

DETAILED DESCRIPTION OF THE PREFERRED EMBODIMENTS

Figure 1:
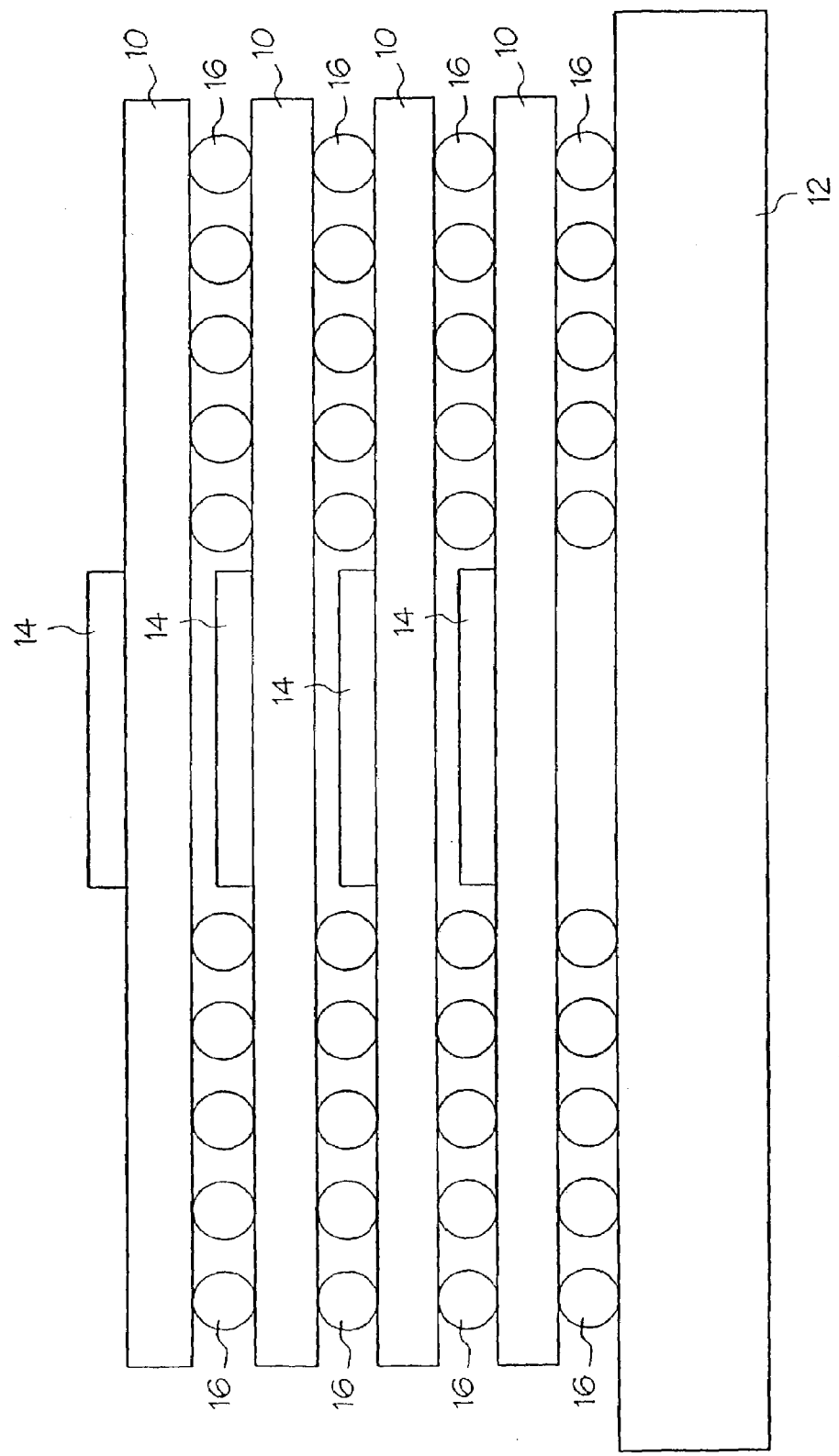
FIG. 1 is a cross-sectional view of a prior art stacking arrangement.
Figure 2:
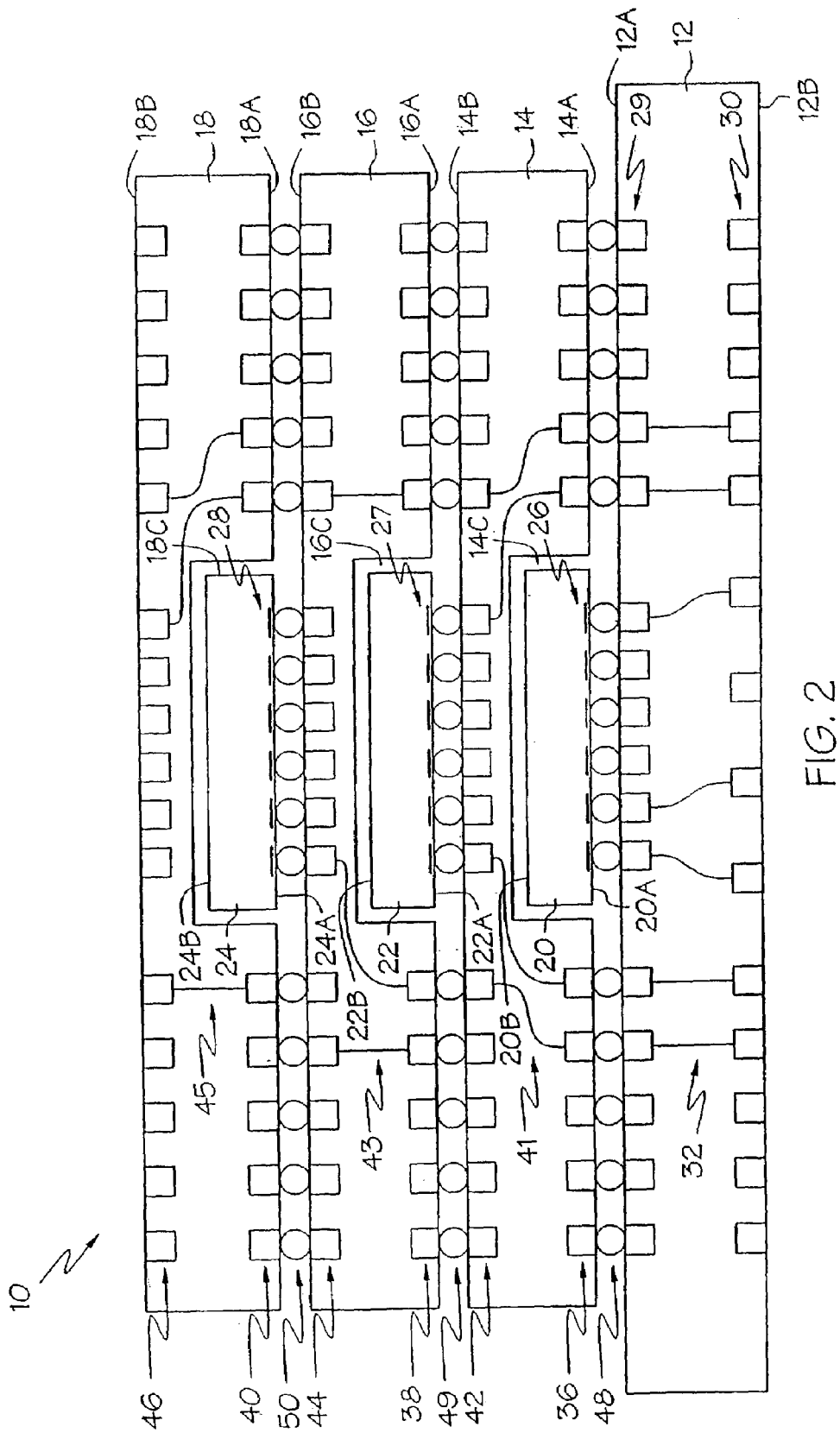
FIG. 2 is a cross-sectional view of a stacking arrangement according to a first embodiment of the present invention.

Referring to FIG. 2, a semiconductor structure 10 is illustrated according to a first embodiment of the present invention. The semiconductor structure 10 comprises a base substrate 12, a first substrate 14, a second substrate 16, a third substrate 18, a first semiconductor device 20, a second semiconductor device 22, and a third semiconductor device 24. The semiconductor devices 20, 22, 24 comprise at least one semiconductor die, either in the form of a bare semiconductor die or a semiconductor package. The semiconductor die itself may be in the form of an integrated circuit, a discrete semiconductor component, e.g., diode, transistor, or any other semiconductor component having an active semiconductor area. In the illustrated embodiment, the semiconductor devices 20, 22, 24 are semiconductor packages in the form of flip chips. However, it will be appreciated by those skilled in the art that the semiconductor packages may comprise chip-scale packages (CSPs), ball grid arrays (BGAs), chip-on-board (COB), direct chip attach (DCA), and other similar packages. Regardless of the form, the semiconductor devices 20, 22, 24 comprise a plurality of first semiconductor device bond pads 26, a plurality of second semiconductor device bond pads 27, and a plurality of third semiconductor device bond pads 28, respectively, formed on respective frontsides 20A, 22A, 24A of the semiconductor devices 20, 22, 24. The bond pads 26, 27, 28 may be arranged in a uniform pattern or non-uniform pattern as required for the particular application. The backsides 20B, 22B, 24B of the semiconductor devices 20, 22, 24 typically do not include any bond pads but may be electrically biased as is known in the art and as required for the particular application.

The base substrate 12 includes a first surface 12A having a first plurality of base substrate bond pads 29 formed thereon and a second surface 12B having a second plurality of base substrate bond pads 30 formed thereon. The base substrate 12 also includes a plurality of base substrate trace leads 32, a representative portion being shown in FIG. 2. The base substrate trace leads 32 are formed using methods well known in the art for interconnecting the first plurality of base substrate bond pads 28 and the second plurality of base substrate bond pads 30 to each other and other components, as required for the particular application. Accordingly, the base substrate trace leads 32 extend within the base substrate 12 and on either or both of the first surface 12A and the second surface 12B for connection with other components. The second plurality of base substrate bond pads 30 are configured to interface and communicate with external circuitry, such as a processor, a bus or other base substrates. In the illustrated embodiment, the base substrate 12 is a printed circuit board functioning as a motherboard. However, it will be appreciated by those skilled in the art that the base substrate 12 may comprise other carriers for the mounting of semiconductor devices and electronic components. The bond pads 29, 30 may be arranged in a uniform pattern or non-uniform pattern as required for the particular application.

The first, second and third substrates 14, 16, 18 each include a first surface 14A, 16A, 18A having a first plurality of substrate bond pads 34, 38, 40 formed respectively thereon, a second surface 14B, 16B, 18B having a second plurality of substrate bond pads 40, 42, 44 formed respectively thereon, and a cavity 14C, 16C, 18C formed respectively therein. The bond pads 40, 42, 44 may be arranged in a uniform pattern or non-uniform pattern as required for the particular application. The cavities 14C, 16C, 18C may be formed as the substrates 14, 16, 18 are fabricated, e.g., formed as part of the substrate mold, or machined into the substrates after the substrates are fabricated. The substrates 14, 16, 18 also each include a plurality of substrate trace leads 41, 43, 45, representative portions being shown in FIG. 2. The trace leads 41, 43, 45 are formed using methods well known in the art for interconnecting the respective first plurality of substrate bond pads 34, 36, 38 and the respective second plurality of substrate bond pads 42, 44, 46 to each other and other components, as required for the particular application. Accordingly, the trace leads 41, 43, 45 extend within each respective substrate 14, 16, 18 and on either or both of the first surface 14A, 16A, 18A and the second surface 14B, 16B, 18B for connection with other components. In the illustrated embodiment, the substrates 14, 16, 18 comprise printed circuit boards. However, it will be appreciated by those skilled in the art that the substrates 14, 16, 18 may comprise other carriers for the mounting of semiconductor devices and electronic components.

The first semiconductor device 20 and the first substrate 14 are mounted on the first surface 12A of the base substrate 12 using a plurality of solder balls 48. Accordingly, the base substrate bond pads 29, the first semiconductor bond pads 26 and the first substrate bond pads 36 are preferably positioned so that each respective bond pad pair is aligned perpendicularly. The solder balls 48 are positioned between corresponding pairs of bond pads 26, 29 and 36, 29 so that the first semiconductor device 20 and the first substrate 14 are electrically and physically coupled to the base substrate 12. The first substrate 14 is positioned so that the first semiconductor device 20 is positioned within the cavity 14C. As the first semiconductor device 20 is positioned within the cavity 14C, the relative height of the semiconductor device/substrate stack is relatively small. Further, the thickness of the solder balls 48 is reduced compared to a stack in which the substrate must extend completely over the semiconductor device. The second semiconductor device 22 and the second substrate 16 are similarly mounted on the second surface 14B of the first substrate 14 using a plurality of solder balls 49 while the third semiconductor device 24 and the third substrate 18 are mounted on the second surface 16B of the second substrate 16 using a plurality of solder balls 50. It should be apparent the signal length between successive semiconductor devices is reduced compared to the prior art as the signals from the base substrate 12 pass through one less substrate for each semiconductor device.

Figure 3:
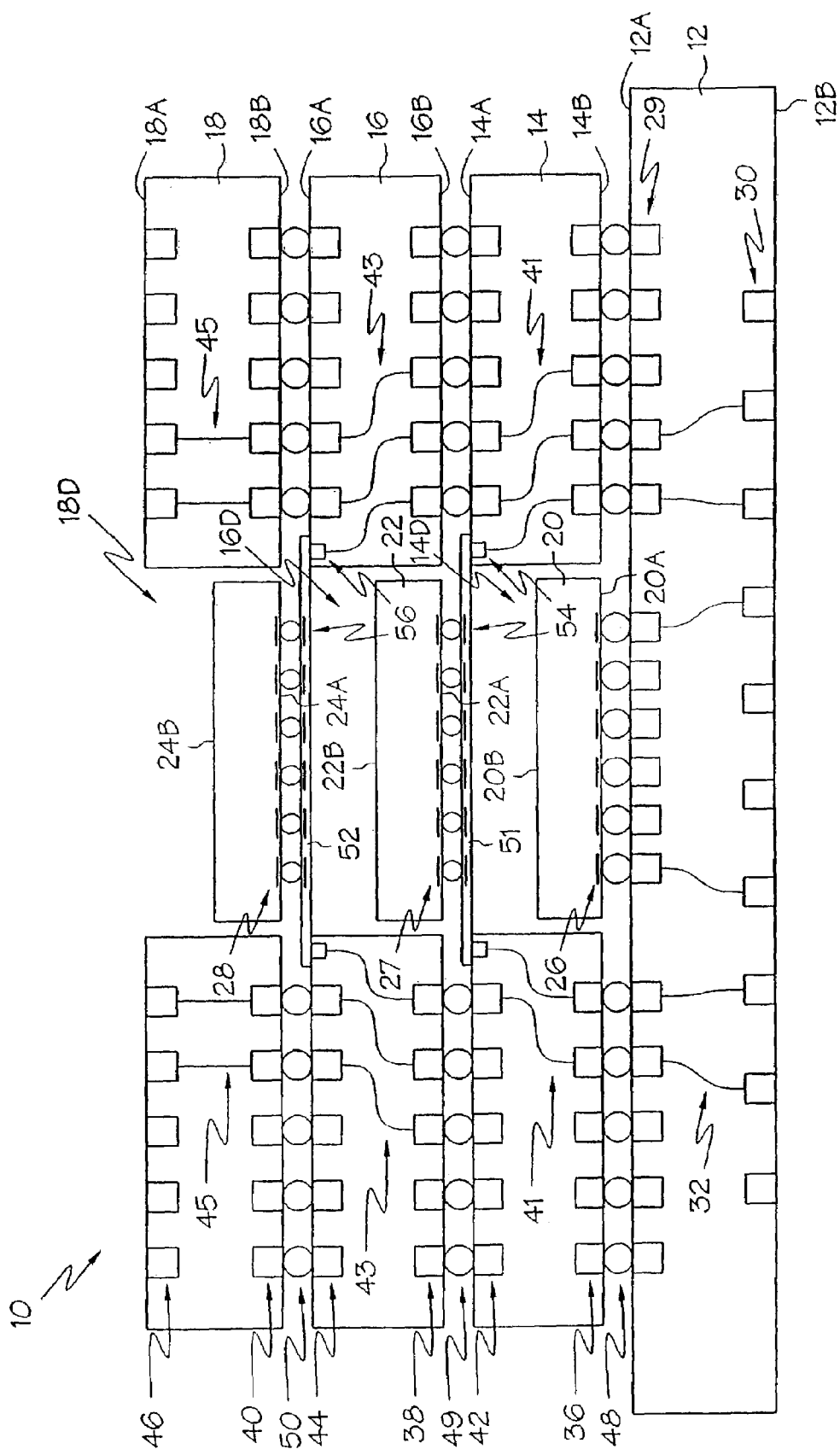
FIGS. 3 and 4 are cross-sectional views of a stacking arrangement according to a second embodiment of the present invention.
Figure 4:
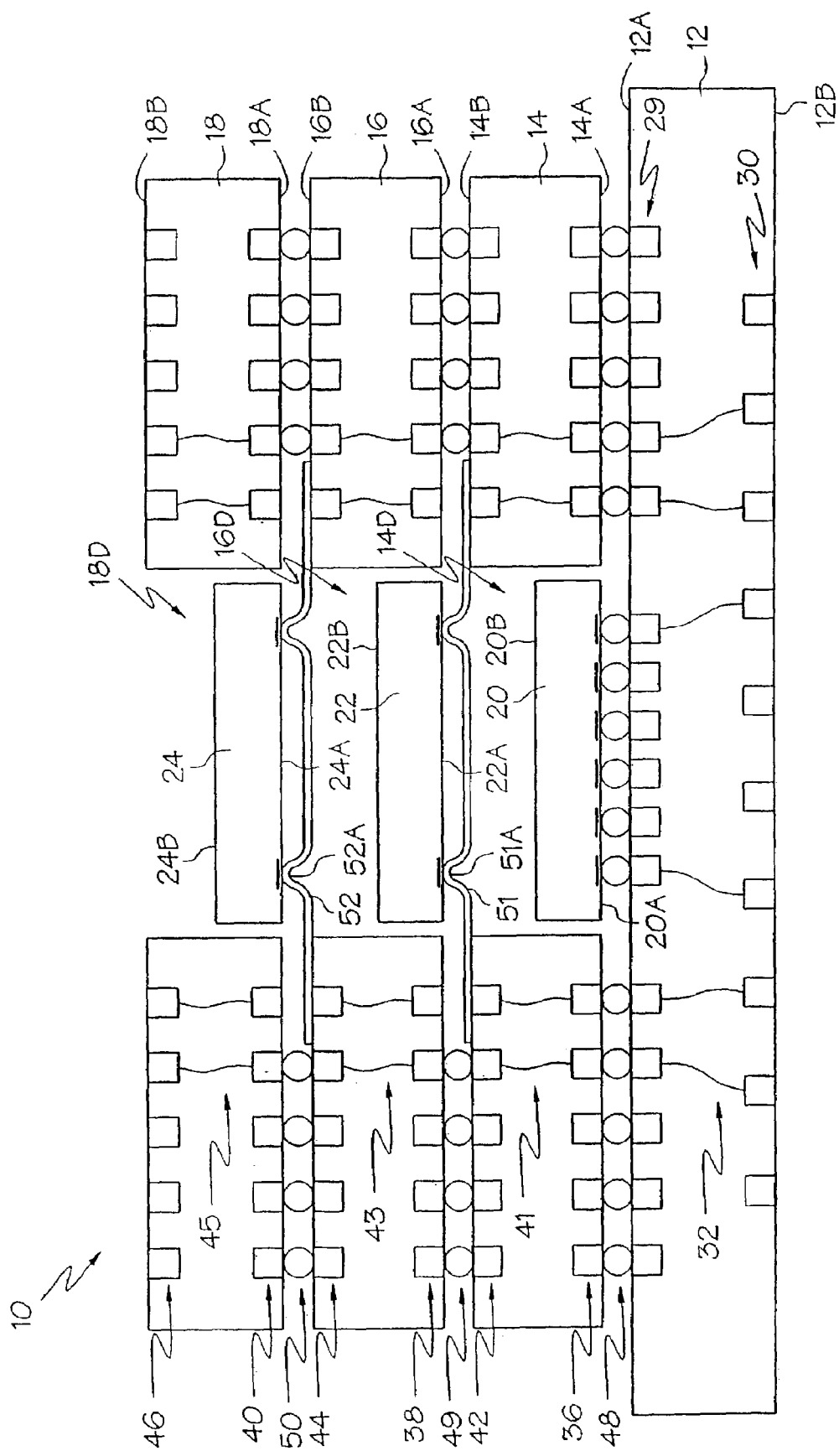

Referring now to FIGS. 3 and 4, with like reference numerals corresponding to like elements, the semiconductor structure 10 is shown according to a second embodiment of the present invention. In this embodiment, the cavities 14A, 16A, 18A are replaced with openings 14D, 16D, 18D extending completely through each respective substrate 14, 16, 18. The semiconductor structure 10 also includes a first interconnect device 51 and a second interconnect device 52. In the illustrated embodiment of FIG. 3, the interconnect devices 51, 52 are conventional flex circuits known in the art. A flex circuit generally includes a plurality of wires or traces encapsulated in polyimide. As the name suggests, a flex circuit is flexible and may bend without damaging the wires. In the illustrated embodiment of FIG. 4, the interconnect devices 51, 52 comprise conventional TAB tape. TAB tape is similar to a flex circuit except it includes conductive bumps 51A, 52A for interfacing with bond pads on semiconductor devices. Connection is made through a combination of heat and pressure. Whether the interconnect devices 51, 52 are flex circuits, TAB tape or other similar interconnect devices, the wires in the interconnect devices 51, 52 terminate in a plurality of contacts 54, 56, respectively, for interfacing with bond pads or other similar interfaces. For TAB tape, a portion of the contacts 54, 56, include the conductive bumps 51A, 52A described above.

The first interconnect device 51 is mounted to the second surface 14B of the first substrate 14 generally over the opening 14D. The first interconnect device 51 is mounted to the first substrate 14 using methods known in the art to electrically and physically couple a portion of the contacts 54 to corresponding bond pads 42 on the second surface 14B of the first substrate 14. It will be appreciated by those skilled in the art that the interconnect device 51 may be physically secured to the first substrate 14 using an appropriate adhesive, in place of or in addition to the physical coupling provided by the contacts 54 and the bond pads 42. The second semiconductor device 22 is coupled to the first interconnect device 50 using the solder balls 49 to electrically and physically couple the second semiconductor device bond pads 27 to corresponding contacts 54 on the first interconnect device 51. The second interconnect device 52 is similarly mounted to the second surface 16B of the second substrate 14 generally over the opening 16D and the third semiconductor device 24 is similarly coupled to the second interconnect device 52. The substrates 14, 16, 18 are positioned with respect to the base substrate 12 and with respect to each other so that the semiconductor devices 20, 22, 24 are positioned generally within respective openings 14D, 16D and 18D. The first and second interconnect devices 51, 52 therefore provide a structural interface and an electrical interface for mounting the semiconductor devices 22, 24 over the openings 14D and 16D, respectively. Accordingly, the overall height of the semiconductor structure 10 is reduced and the length of the signal paths between successive semiconductive devices is shorter compared to the prior art.

Figure 5:
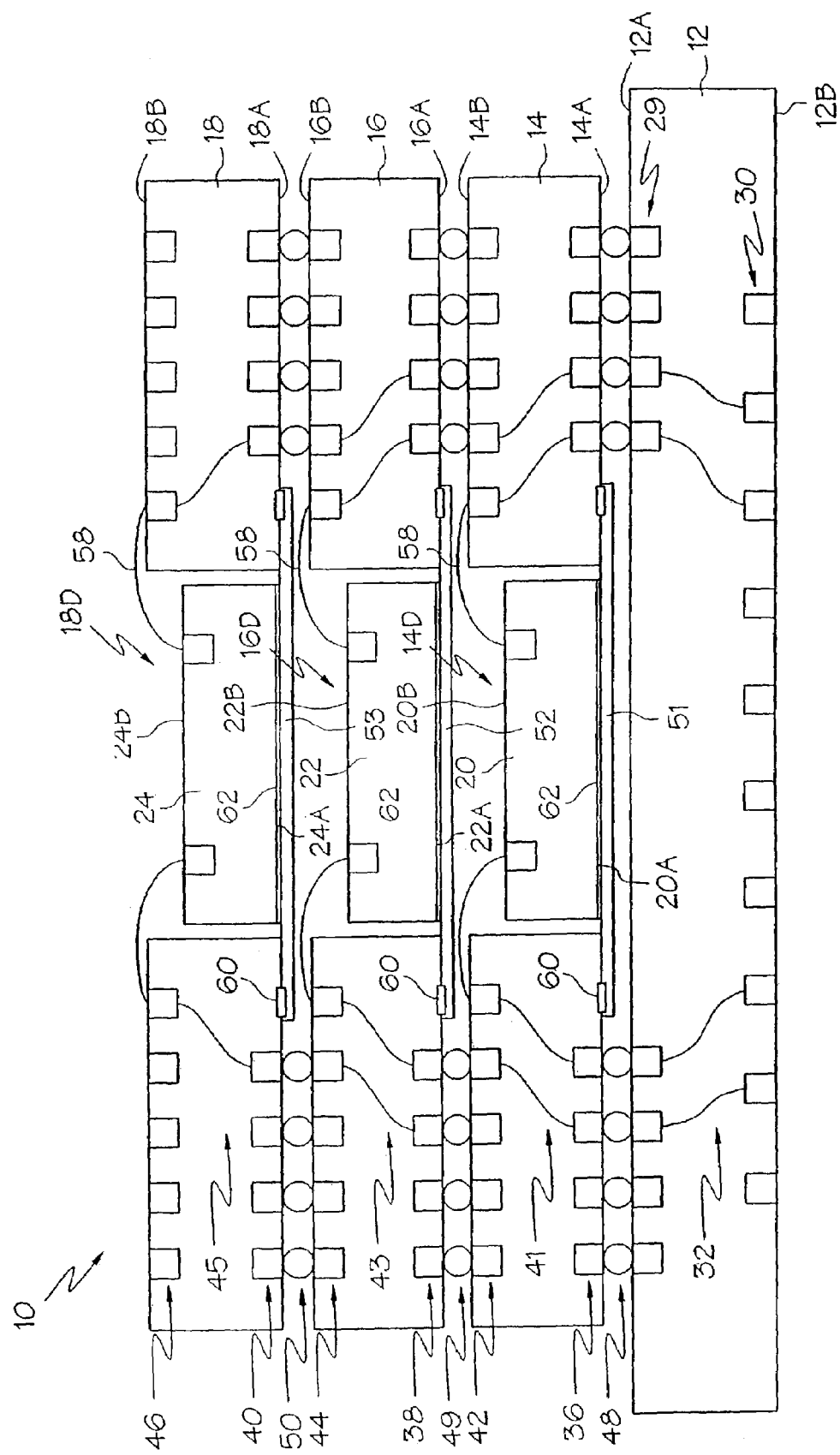
FIGS. 5 and 6 are cross-sectional views of a stacking arrangement according to a third embodiment of the present invention.
Figure 6:
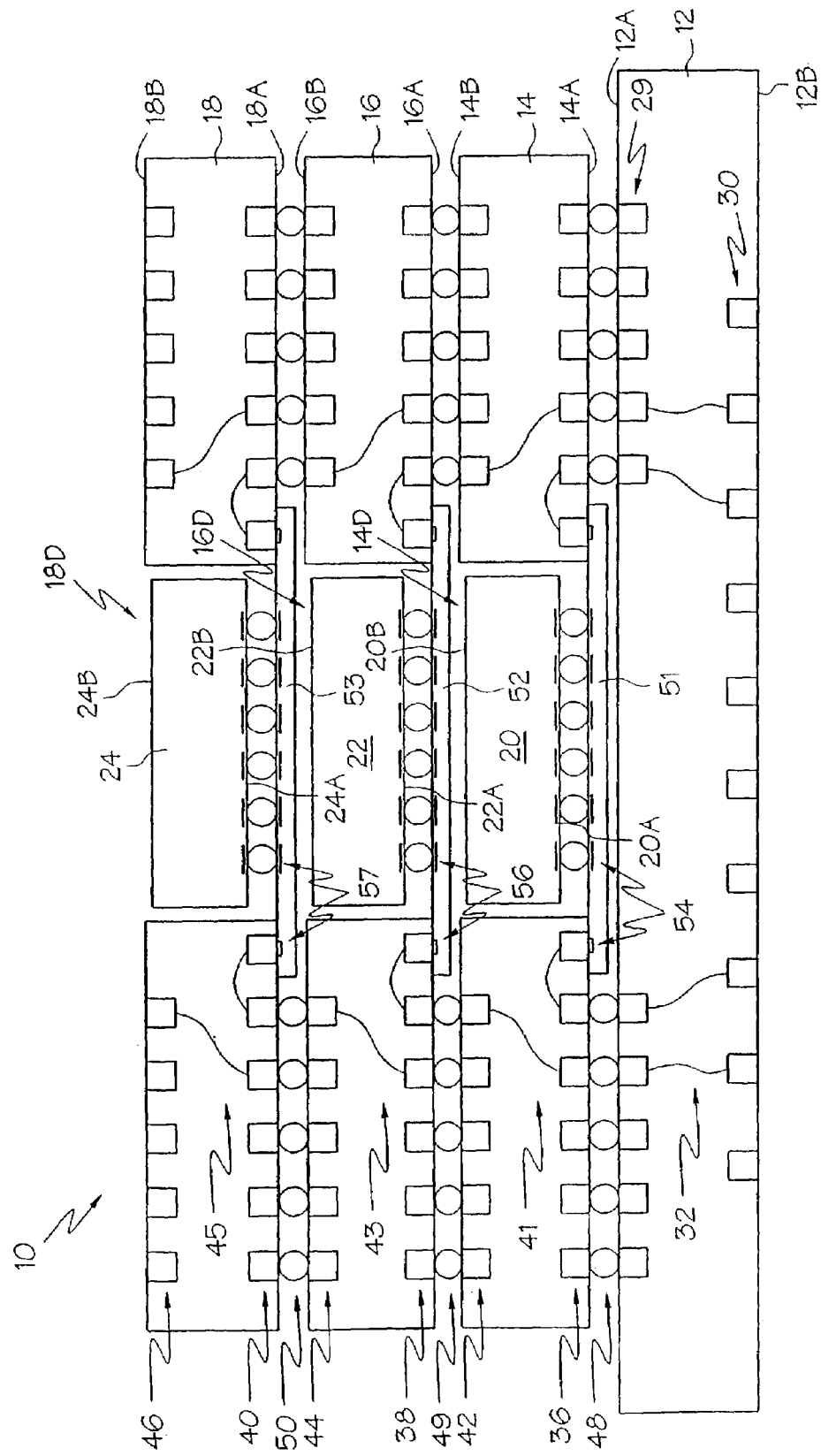

Referring now to FIGS. 5 and 6, with like reference numerals corresponding to like elements, the semiconductor structure 10 is shown according to a third embodiment of the present invention. In this embodiment, a third interconnect device 53 is shown with interconnect devices 51, 52 mounted to corresponding first surfaces 14A, 16A, 18A generally over respective openings 14D, 16D, 18D. In the illustrated embodiment of FIG. 5, the interconnect devices 51, 52, 53 function to provide a structural interface for the semiconductor devices 20, 22, 24, respectively. The interconnect devices 51, 52, 53 may comprise a flex circuit without any conductive wires, and thus, is non-conductive, or a flex circuit in which there is no electrical connection with the conductive wires. The interconnect devices 51, 52, 53 are coupled to the substrates 14, 16, 18, respectively, using an appropriate adhesive 60 or other suitable fastening means.

The semiconductor devices 14, 16, 18 are mounted on the interconnect devices 51, 52, 53, respectively, using an appropriate adhesive 62 or other suitable semiconductor fastening means, such that the semiconductor devices 14, 16,18 are positioned within respective openings 14D, 16D, 18D of the respective substrates 14, 16,18. Thus, in this embodiment, the semiconductor devices 20,22, 24 are positioned generally within respective substrates 14, 16, 18 while in the second embodiment the semiconductor devices 22, 24 are positioned over respective substrates 14,16. The semiconductor devices 14, 16, 18 are electrically coupled to respective substrates 51, 52, 53 using bond wires 58 coupling portions of respective second plurality of substrate bond pads 42, 44, 46 to respective plurality of semiconductor device bond pads 26, 27, 28. It will be appreciated by those skilled in the art that the backsides 20B, 22B, 24B of the semiconductor devices 20, 22, 24 may be electrically coupled to respective interconnect devices 51, 52, 53 by electrically coupling a portion of the contacts 54, 56 on the interconnect devices 51, 52, 53 to respective first plurality substrate bond pads 36, 38, 40 and another portion of the contacts 54, 56 to the backsides of the semiconductor devices 20, 22, 24.

In the illustrated embodiment of FIG. 6, the interconnect devices 51, 52, 53 are electrically and physically coupled to respective substrates 14, 16, 18 as a portion of the contacts 54, 56, 57 (with reference numeral 57 representing contacts in the third interconnect device 53) are coupled to corresponding respective first plurality substrate bond pads 36, 38, 40. It will be appreciated by those skilled in the art that the interconnect device 51, 52, 53 may be physically secured to the respective substrates 14, 16, 18 using an appropriate adhesive, in place of or in addition to the physical coupling provided by the contacts 54, 56, 57 and the bond pads 36, 38, 40. The semiconductor devices 20, 22, 24 are also electrically and physically coupled to respective interconnect devices 51, 52, 53 as respective semiconductor bond pads 26, 27, 28 are coupled to portions of respective contacts 54, 56, 57 of the interconnect devices 51, 52, 53 using the solder balls 48, 49, 50. The interconnect devices 51, 52, 53 therefore provide a structural interface and an electrical interface for mounting the semiconductor devices 20, 22, 24 generally within the openings 14D, 16D, 18D, respectively. The overall height of the semiconductor structure 10 is again reduced and the length of the signal paths between successive semiconductive devices is also shorter as compared to the prior art.

As the semiconductor devices 20, 22, 24 are positioned generally within cavities or openings formed in the substrates, the semiconductor devices 20, 22, 24 may be aligned so that a center of the semiconductor devices intersect a line which is substantially perpendicular to the base substrate 12 and the other substrates 14, 16, 18. However, it should be apparent that the semiconductor devices 20, 22, 24, from one substrate to another, may be aligned as required for a particular application. The semiconductor devices 20, 22, 24 may therefore be offset with respect to each other. Similarly, the substrates 14, 16, 18 may be aligned together or offset from each other.

It is to be understood that the embodiments of the present invention are illustrative only, as the number of substrates and semiconductor devices may vary depending on the particular application. It will be appreciated by those skilled in the art that each of the substrates may include a plurality of cavities or openings along with a requisite number of interconnect devices, as appropriate, to accommodate a desired number of semiconductor devices. The semiconductor devices, and hence, the cavities or openings may be formed in a uniform or non-uniform pattern as required for a particular application. It will be further appreciated by those skilled in the art that a plurality of substrates may be mounted on the base substrate 12 or on each other as required for a particular application. It should be apparent that the substrates may be configured to support semiconductor devices of varying types and sizes such that there is no restriction to the types and sizes of semiconductor devices that may be used. Further, the semiconductor structure 10 may be configured as a hybrid of two or more of the embodiments disclosed in the present invention.

Having described the invention in detail and by reference to preferred embodiments thereof, it will be apparent that modifications and variations are possible without departing from the scope of the invention defined in the appended claims.

What is claimed is:

1. A semiconductor structure comprising:
   a first substrate having a first surface;
   a first semiconductor device electrically and physically coupled to said first surface of said first substrate; and
   a second substrate having a first surface, a second surface, and a cavity formed in said first surface, said second substrate positioned over and both electrically and physically coupled to said first substrate such that said first semiconductor device is positioned at least partially within said cavity.

2. The semiconductor structure according to claim 1, wherein said second substrate is electrically coupled to said first substrate by conductive balls, and said semiconductor device is electrically coupled to said first substrate by conductive balls.

3. The semiconductor structure according to claim 1, wherein:
   said first semiconductor device further comprises electrically conductive semiconductor device pads;
   said first substrate further comprises electrically conductive first substrate pads; and
   said first semiconductor device is electrically and physically coupled to said first substrate by a plurality of conductive balls, each conductive ball arranged to couple a select one of said semiconductor device pads to an associated on of said first substrate pads.

4. The semiconductor structure according to claim 1, wherein said first semiconductor device is positioned entirely within said cavity.

5. The semiconductor structure according to claim 1, further comprising:
   a second semiconductor device electrically and physically coupled to said second surface of said second substrate.

6. The semiconductor structure according to claim 5, further comprising:
   a third substrate having a first surface, a second surface, and a cavity formed in said first surface, said third substrate positioned over and coupled to said second substrate such that said second semiconductor device is positioned at least partially within said cavity of said third substrate.

7. The semiconductor structure according to claim 1, further comprising at least one additional semiconductor device electrically and physically coupled to said first substrate and positioned at least partially within said cavity.

8. The semiconductor structure according to claim 1, further comprising at least one additional semiconductor device electrically and physically coupled to said first substrate, wherein said second substrate further comprises at least one additional cavity formed in said first surface, said second substrate positioned over and coupled to said first substrate such that at least one semiconductor device is positioned at least partially within each cavity.

9. A semiconductor structure comprising:
   a base substrate having a first surface;
   a first semiconductor device electrically and physically coupled to said first surface of said base substrate; and
   a first substrate having a first surface, a second surface, and a cavity formed in said first surface, said first substrate positioned over and both electrically and physically coupled to said base substrate such that said first semiconductor device is positioned at least partially within said cavity.

10. The semiconductor structure according to claim 9, wherein said first substrate is electrically coupled to said base substrate by conductive balls, and said semiconductor device is electrically coupled to said base substrate by conductive balls.

11. The semiconductor structure according to claim 9, wherein:
   said first semiconductor device further comprises electrically conductive semiconductor device pads;
   said base substrate further comprises electrically conductive base substrate pads; and
   said first semiconductor device is electrically and physically coupled to said base substrate by a plurality of conductive balls, each conductive ball arranged to couple a select one of said semiconductor device pads to an associated on of said base substrate pads.

12. The semiconductor structure according to claim 9, wherein said first semiconductor device is positioned entirely within said cavity.

13. The semiconductor structure according to claim 9, further comprising:
a second semiconductor device electrically and physically coupled to said second surface of said first substrate.

14. The semiconductor structure according to claim 13, further comprising:
a second substrate having a first surface, a second surface, and a cavity formed in said first surface, said second substrate positioned over and coupled to said first substrate such that said second semiconductor device is positioned at least partially within said cavity of said second substrate.

15. The semiconductor structure according to claim 9, further comprising at least one additional semiconductor device electrically and physically coupled to said base substrate and positioned at least partially within said cavity.

16. The semiconductor structure according to claim 9, further comprising at least one additional semiconductor device electrically and physically coupled to said base substrate, wherein said first substrate further comprises at least one additional cavity formed in said first surface, said first substrate positioned over and coupled to said base substrate such that at least one semiconductor device is positioned at least partially within each cavity.

17. A semiconductor structure comprising:
a first substrate having a first surface and a plurality of conductive first substrate pads on said first surface;
a second substrate having a first surface, a second surface, a plurality of conductive second substrate pads on said first surface and a cavity formed in said first surface, said second substrate positioned over said first substrate such said cavity is directed towards said first surface of said first substrate; and
a semiconductor device having a plurality of conductive semiconductor device pads, said semiconductor device arranged over said first surface of said first substrate and positioned at least partially within said cavity of said second substrate, wherein both said semiconductor device and said second substrate are electrically coupled to said first substrate by conductive balls, a select conductive ball electrically coupling a first substrate pad to a select one semiconductor device pad or a select one second substrate pad.

18. The semiconductor structure according to claim 17, wherein said semiconductor device is positioned entirely within said cavity.

19. A semiconductor structure comprising:
a base substrate having a first surface and a plurality of conductive base substrate pads on said first surface;
a first substrate having a first surface, a second surface, a plurality of conductive first substrate pads on said first surface and a cavity formed in said first surface, said first substrate positioned over said base substrate such said cavity is directed towards said first surface of said base substrate; and
a semiconductor device having a plurality of conductive semiconductor device pads, said semiconductor device arranged over said first surface of said base substrate and positioned at least partially within said cavity of said first substrate, wherein both said semiconductor device and said first substrate are electrically coupled to said base substrate by conductive balls, a select conductive ball electrically coupling a base substrate pad to a select one semiconductor device pad or a select one first substrate pad.

20. The semiconductor structure according to claim 19, wherein said semiconductor device is positioned entirely within said cavity.

21. A semiconductor structure comprising:
a base substrate having a first surface including a first plurality of conductive base substrate pads formed thereon;
a first semiconductor device having a plurality of conductive semiconductor device pads, a select one of said plurality of semiconductor device pads electrically coupled to an associated one of said first plurality of base substrate pads; and
a first substrate having a first opening extending completely therethrough, said first substrate positioned over and coupled to said base substrate such that said first semiconductor device is positioned generally within said first opening.

22. The semiconductor structure according to claim 21, wherein said first semiconductor device is electrically coupled to said base substrate by conductive balls.

23. The semiconductor structure according to claim 21, further comprising:
an interconnect device positioned at least partially over said first opening and coupled to said first substrate.

24. The semiconductor structure according to claim 23, further comprising a second semiconductor device electrically and physically coupled to said interconnect device.

25. The semiconductor structure according to claim 23, further comprising a second semiconductor device electrically and physically coupled to said interconnect device, wherein said interconnect device comprises a flex circuit and said second semiconductor device is electrically coupled to said flex circuit by conductive balls.

26. The semiconductor structure according to claim 23, further comprising a second semiconductor device electrically and physically coupled to said interconnect device, wherein said interconnect device comprises a TAB tape having conductive bumps electrically coupled to said second semiconductor device.

27. The semiconductor structure according to claim 21, further comprising at least one additional semiconductor device electrically and physically coupled to said base substrate and positioned generally within said opening.

28. The semiconductor structure according to claim 21, further comprising at least one additional semiconductor device electrically and physically coupled to said base substrate, wherein said first substrate further comprises at least one additional opening therein, said first substrate positioned over and coupled to said base substrate such that at least one semiconductor device is positioned generally within each opening.

29. A semiconductor structure comprising:
a first substrate having an opening therethrough;
a first interconnect device positioned over said opening and coupled to said first substrate; and
a first semiconductor device having a plurality of conductive semiconductor device pads, said first semiconductor device positioned generally over said opening and said first interconnect device and arranged such that at least one of said plurality of semiconductor device pads is electrically coupled to said interconnect device.

30. The semiconductor structure according to claim 29, wherein said first semiconductor device is electrically coupled to said interconnect device by conductive balls.

31. The semiconductor structure according to claim 29, wherein said first interconnect device comprises a flex circuit and said first semiconductor device is electrically coupled to said flex circuit by conductive balls such that a select conductive ball electrically couples a select semiconductor device pad to an associated contact on said interconnect device.

32. The semiconductor structure according to claim 29, wherein said interconnect device comprises a TAB tape having conductive bumps arranged such that a select conductive bump electrically couples to an associated semiconductor device pad.

33. The semiconductor structure according to claim 29, further comprising at least one additional semiconductor device electrically and physically coupled to said interconnect device and positioned generally over said opening.

34. The semiconductor structure according to claim 29, wherein said first substrate further comprises at least one additional opening therein, each opening at least partially covered by an associated interconnect device, and further comprising at least one additional semiconductor device positioned over, and electrically coupled to each associated interconnect device.

35. A semiconductor structure comprising:
a base substrate having a first surface including a first plurality of conductive base substrate pads formed thereon;
a first semiconductor device having a plurality of conductive first semiconductor device pads, said first semiconductor device positioned over said base substrate and electrically coupled thereto such that a select first semiconductor device pad is electrically coupled to an associated base substrate pad by a conductive ball;
a first substrate having an opening therethrough, said first substrate arranged over said base substrate and coupled thereto such that said first semiconductor is positioned generally within said opening;
an interconnect device positioned over said opening, said interconnect device electrically and physically coupled to said first substrate; and
a second semiconductor device having a plurality of conductive second semiconductor device pads, said second semiconductor device positioned generally over said opening and electrically coupled to said interconnect device.

36. A semiconductor structure comprising:
a base substrate having a first surface;
a first substrate having a first surface, a second surface and a first opening entirely through said first substrate, said first substrate coupled to said base substrate;
a first interconnect device coupled to said first substrate and positioned between said first substrate and said base substrate such that said interconnect device extends across at least a portion of said first opening; and
a first semiconductor device positioned generally within said first opening of said first substrate and coupled to said first interconnect device.

37. The semiconductor structure according to claim 36, wherein said first semiconductor device is electrically coupled to said first interconnect device by conductive balls.

38. The semiconductor structure according to claim 37, wherein said first interconnect device is further electrically coupled to said first substrate.

39. The semiconductor structure according to claim 36, wherein said first semiconductor device is electrically coupled to said first substrate by bond wires.

40. The semiconductor structure according to claim 36, wherein said interconnect device comprises a flex circuit and said second semiconductor device is electrically coupled to said flex circuit by conductive balls.

41. The semiconductor structure according to claim 36, further comprising at least one additional semiconductor device coupled to said first interconnect device and positioned generally within said first opening of said first substrate.

42. The semiconductor structure according to claim 36, further comprising at least one additional interconnect device, wherein said first substrate further comprises at least one additional opening therein, a select additional interconnect device coupled to said first substrate and positioned between said first substrate and said base substrate such that said select additional interconnect device extends across at least a portion of an associated additional opening, and further comprising at least one semiconductor device positioned generally within each additional opening.

43. A semiconductor structure comprising:
a first substrate having a first surface, a second surface and a first substrate opening entirely through said first substrate;
a first interconnect device coupled to said second surface of said first substrate arranged to extend across at least a portion of said first substrate opening;
a first semiconductor device positioned generally within said first substrate opening of said first substrate and coupled to said first interconnect device;
a second substrate having a first surface, a second surface and a second substrate opening entirely therethrough, said second substrate positioned over said first substrate and coupled thereto;
a second interconnect device coupled to said second surface of said second substrate arranged to extend across at least a portion of said second substrate opening, between said first and second substrates; and
a second semiconductor device positioned generally within said second substrate opening of said second substrate and coupled to said second interconnect device.

44. A semiconductor structure comprising:
a first substrate having a first surface;
a first semiconductor device electrically and physically coupled to said first surface of said first substrate by conductive balls; and
a second substrate having a first surface, a second surface, and a cavity formed in said first surface, said second substrate positioned over and both electrically and physically coupled to said first substrate such that said first semiconductor device is positioned at least partially within said cavity.

45. A semiconductor structure comprising:
a base substrate having a first surface;
a first semiconductor device electrically and physically coupled to said first surface of said base substrate by conductive balls; and
a first substrate having a first surface, a second surface, and a cavity formed in said first surface, said first substrate positioned over and both electrically and physically coupled to said base substrate such that said first semiconductor device is positioned at least partially within said cavity.

* * * * *